United States Patent
Lai et al.

(10) Patent No.: US 7,005,363 B2
(45) Date of Patent: Feb. 28, 2006

(54) METHOD OF FORMING A SEMI-INSULATING REGION

(75) Inventors: Joey Lai, Taipei Hsien (TW); Water Lur, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/907,052

(22) Filed: Mar. 18, 2005

(65) Prior Publication Data

US 2005/0148207 A1  Jul. 7, 2005

Related U.S. Application Data

(62) Division of application No. 10/605,681, filed on Oct. 17, 2003.

(51) Int. Cl.
*H01L 21/04* (2006.01)
*H01L 21/20* (2006.01)
*H01L 21/36* (2006.01)
*H01L 21/425* (2006.01)

(52) U.S. Cl. .............. 438/510; 438/949; 438/480; 438/528

(58) Field of Classification Search ............ 438/528, 438/949, 510, 514, 526, 480, 462
See application file for complete search history.

(56) References Cited

U.S. PATENT DOCUMENTS

| 4,398,964 A * | 8/1983 | Malwah ................ 438/526 |
| 5,554,562 A * | 9/1996 | Chang et al. ............ 438/400 |
| 5,693,548 A * | 12/1997 | Lee et al. .............. 438/172 |
| 6,165,896 A * | 12/2000 | Schnabel et al. ........ 438/636 |
| 6,313,905 B1 * | 11/2001 | Brugger et al. .......... 355/55 |
| 6,399,448 B1 * | 6/2002 | Mukhopadhyay et al. .. 438/275 |
| 6,716,741 B1 * | 4/2004 | Chang et al. ............ 438/623 |
| 6,794,264 B1 * | 9/2004 | Dolan et al. ............ 438/407 |
| 6,815,347 B1 * | 11/2004 | Sumi .................. 438/669 |
| 2002/0081824 A1 * | 6/2002 | Dolan et al. ............ 438/480 |
| 2003/0228728 A1 * | 12/2003 | Yu et al. ................ 438/201 |
| 2004/0048398 A1 * | 3/2004 | Liang et al. .............. 438/3 |
| 2005/0085004 A1 * | 4/2005 | Lai et al. .............. 438/100 |
| 2005/0148207 A1 * | 7/2005 | Lai et al. .............. 438/795 |
| 2005/0170619 A1 * | 8/2005 | Lai et al. .............. 438/528 |

* cited by examiner

*Primary Examiner*—Walter L. Lindsay, Jr.
(74) *Attorney, Agent, or Firm*—Winston Hsu

(57) ABSTRACT

A semiconductor substrate is provided, and at least one first mask is formed above the semiconductor substrate. The first mask has a plurality of thicknesses and blocks at least one semi-insulating region. A second mask is thereafter formed on a surface of the semiconductor substrate. The second mask covers the semi-insulating region. The semi-insulating region is implanted with a high energy beam of particles by utilizing the second mask and the first mask as particle hindering masks. Finally, the second mask is removed.

22 Claims, 15 Drawing Sheets

METHOD OF FORMING A SEMI-INSULATING REGION

CROSS REFERENCE TO RELATED APPLICATIONS

This application is a divisional of application Ser. No. 10/605,681 filed Oct. 17, 2003.

BACKGROUND OF INVENTION

1. Field of the Invention

The present invention relates to a method of forming a semi-insulating region, and more particularly, to a method of forming a semi-insulating region applied to a radio frequency chip (RF chip) and integrated with very large scale integrated circuit (VLSI circuit) process.

2. Description of the Prior Art

The global wireless communication market is developing rapidly; the wireless communication business is thus becoming a rising star. Though the wireless communication products are different from each other due to the combinations of system configurations, user's applications, modulation methods, and channel receiving methods, the key components of them are typically comprised in the radio frequency/intermediate frequency integrated circuit (RF/IF IC) and the baseband integrated circuit (baseband IC). In the RF/IF IC, there is a low noise amplifier, a power amplifier, a voltage control oscillator (VCO), a phase lock loop, and passive and discrete devices, etc. In the baseband IC, there is a micro processor, a modulator and a demodulator, an A/D converter and a D/A converter, a digital signal processor (DSP), a memory device, and passive and discrete devices, etc.

Due to the demand of the market, the mobile communication vendors are all devoted to designing products with a cheaper price and smaller size. In other words, the mobile communication vendors try to integrate various components into an individual chip having a specific function, and eventually try to integrate various components into a single chip. While integrating all those components, not only the chip volume needs to be shrunk, but also the cost of the discrete devices could not be raised. In addition, the chip materials and the manufacturing process both impact the size and the cost of chip directly. It is necessary to prevent induced current, which is incurred from the coupling of each device and each integrated circuit on the chip, when applying in a radio frequency range so as to avoid degrading the electrical performance and the reliability of the communication chip.

Please refer to FIG. 1 to FIG. 2, FIG. 1 to FIG. 2 are schematic diagrams of fabricating a communication chip 28 according to the prior art. As shown in FIG. 1, the prior art communication chip 28 is fabricated on a semiconductor wafer 10. The semiconductor wafer 10 is usually a silicon wafer. A metal-oxide-semiconductor circuit (MOS circuit) 12, a micro-strip 14, and a high quality factor inductor (high Q inductor) 16 are comprised on a surface of the semiconductor wafer 10. The entire underside of the semiconductor wafer 10 is covered by a metal ground ring 18. An isolating region 22, disposed underneath the micro-strip 14 and the high quality factor inductor 16 in the semiconductor wafer 10, is disposed to fully decouple the micro-strip 14 and the high quality factor inductor 16 from the integrated circuit.

As shown in FIG. 2, a covering plate, composed of a metal material, is thereafter utilized as a mask 24 to irradiate the semiconductor wafer 10 with an x-ray beam 26. The x-ray beam 26 extends all the way through the whole thickness of the semiconductor wafer 10. The intensity of the x-ray beam 26 is between about 100 and 1,000 kGy/hr, and the photon energy of the x-ray beam 26 is between about 1 keV and 10 keV. The mask 24 is formed from high atomic weight metal materials, such as aluminum, iron, or tungsten. The mask 24, having a thickness of approximate 0.1 to 2 mm, only exposes the isolating region 22 to prevent the region outside the isolating region 22 in the semiconductor wafer 10 from being damaged.

When the semiconductor wafer 10 is irradiated with the x-ray beam 26, the structure along the irradiated path is damaged to increase the resistivity of the semiconductor material in the irradiated area by several orders of magnitude. As a result, the isolating region 22 in the semiconductor wafer 10 is transformed from semiconducting to semi-insulating. After performing some backend metallization process (not shown), the communication chip 28 is completed.

However, this method takes too much time (10 to 100 days). Therefore, another method was developed. Please refer to FIG. 3 to FIG. 4 that are schematic diagrams of fabricating another communication chip 46 according to the prior art. As shown in FIG. 3, the prior art communication chip is fabricated on a semiconductor wafer 30. The semiconductor wafer 30 is usually a silicon wafer. A metal-oxide-semiconductor circuit (MOS circuit) 32, a bipolar circuit 34, and an analog circuit 36 are comprised on a surface of the semiconductor wafer 30. Because it is necessary to decouple these different circuits from one another, two isolating regions 38 extending all the way through the semiconductor wafer 30 are necessary to be formed.

As shown in FIG. 4, a covering plate, composed of a metal material, is thereafter utilized as a mask 42 to irradiate the semiconductor wafer 30 with a high energy beam of particles 44. The high energy beam of particles 44 extends all the way through the whole thickness of the semiconductor wafer 30.

The high energy beam of particles 44 may be a proton beam. The intensity of the high energy beam of particles 44 is between about 1 and 10 microamps, and the particle energy of the high energy beam of particles 44 is between about 1 MeV and 30 MeV. The mask 42 is formed from high atomic weight metal materials, such as aluminum, iron, or tungsten. The mask 42 only exposes the isolating region 38 to prevent the region outside the isolating region 38 in the semiconductor wafer 30 from being damaged.

Similarly, when the semiconductor wafer 30 is irradiated with the high energy beam of particles 44, the structure along the irradiated path is damaged to increase the resistivity of the semiconductor material in the irradiated area by several orders of magnitude. As a result, the isolating region 38 in the semiconductor wafer 30 is transformed from semiconducting to semi-insulating. After performing some backend metallization process (not shown), the communication chip 46 is completed.

In the prior art methods, an isolating region having a significant depth is formed. Neither the conventional shallow trench isolation (STI) nor the field oxide layer (FOX layer), formed by the conventional local oxidation of silicon (LOCOS), is able to achieve such a depth. However, the prior art methods are not suitable for mass production at all since the photoresist layer utilized in the clean room, even the thick film photoresist having a thickness of approximate 200 to 300 $\mu$m, is unable to completely block the beam of particles with such a high energy. In the prior art methods, only a mask composed of metal material is disclosed. This kind of mask, although suitable for certain environments, is not suitable to be used in the clean room due to contamination issues.

However, to implant the communication chip with a beam of high energy particles to reduce the loss of silicon substrate, or the loss of another substrate is an inevitable process step. As mentioned previously, the total coupling problem needs to be resolved first to improve the high frequency performance of a communication chip to an acceptable extent, so as to be able to fabricate products with a wide application range. It is therefore very important to develop a method of forming a semi-insulating region. This method should be suitable to be performed in a clean room and in other environments. This method should utilize the photoresist layer, adapted widely in the clean room, or other substance as masks that are compatible with the manufacturing process of the integrated circuit, and should be integrated into integrated circuit processing to avoid the coupling problem and the inducing current problem when applied to communication chips. Furthermore, this method should be able to form the semi-insulating region with a three dimensional (3D) structure.

SUMMARY OF INVENTION

It is therefore an object of the present invention to provide a method of fabricating a semi-insulating region, and more particularly, a method of forming a semi-insulating region applied to a radio frequency integrated chip (RF integrated chip) having good coupling performance and able to be integrated with a very large scale integrated circuit (VLSI circuit) process.

According to the claimed invention, a semiconductor substrate is first provided. Then, at least one first mask is formed above the semiconductor substrate. The first mask blocks at least one semi-insulating region. A second mask is thereafter formed on a surface of the semiconductor substrate. The second mask covers the semi-insulating region. The semi-insulating region is implanted with a high energy beam of particles by utilizing the second mask and the first mask as particle hindering masks. Finally the second mask is removed.

It is an advantage of the claimed invention that the method of forming a communication chip by utilizing the semi-insulating regions utilizes at least one semiconductor wafer, metal plate, or other substance as the first mask and a photoresist layer as the second mask to perform the high energy particle beam implantation process. Not only are the material compositions of the masks variable, the shapes and the thicknesses of a first pattern and a second pattern, optionally defined in the first mask and in the second mask respectively, can be changed according to the requirements of a specific product. In addition, the implantation energy of the high energy beam of particles can be adjusted. The first mask and the second mask can be simultaneously utilized or only one of them may be utilized. The implantation process may be performed several times as the above-mentioned parameters are adjusted. Utilizing the masks in the present invention method as energy reduction layers, the high energy particles can be implanted into the semiconductor substrate to a predetermined depth accurately so as to form uniform and continuous semi-insulating regions and even to form three dimensional semi-insulating regions in the semiconductor substrate. When applying the present invention method in a practical production line, the effect incurred from the induced current is weakened due to the induced current being confined within each non-insulating region so as to reduce an antenna effect. The substrate loss for a chip is reduced, the total coupling effect is improved, and the noise in a transmission line is decreased. A communication chip with good RF performance is therefore produced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
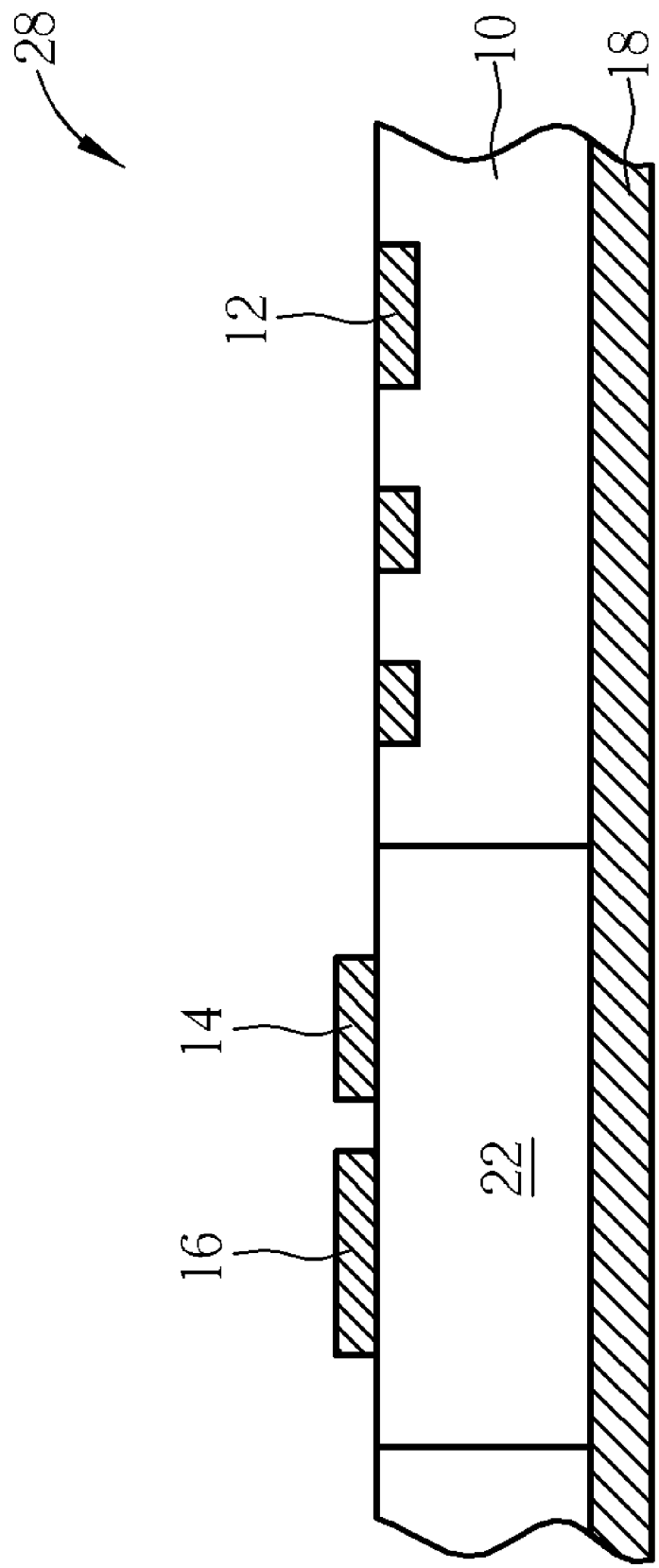
FIG. 1 to FIG. 2 are schematic diagrams of fabricating a communication chip according to the prior art.
Figure 2:
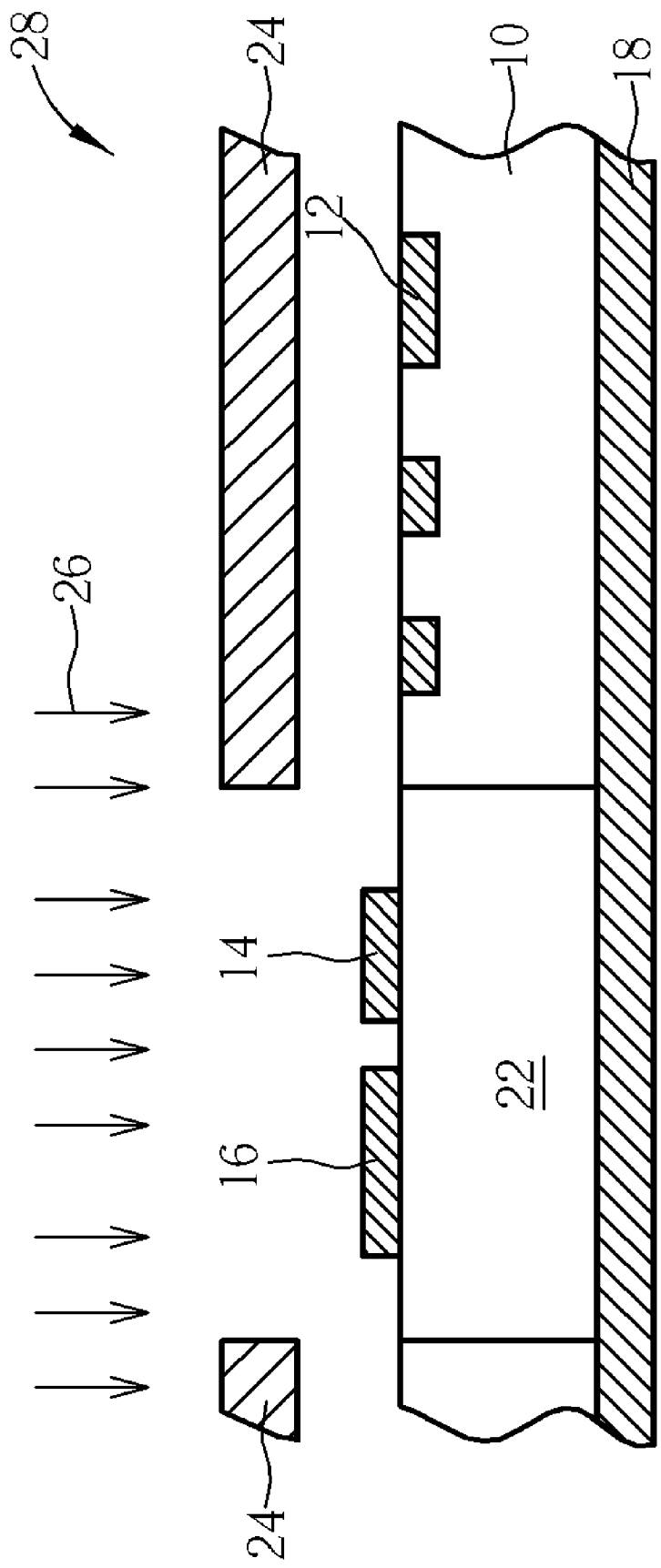
Figure 3:
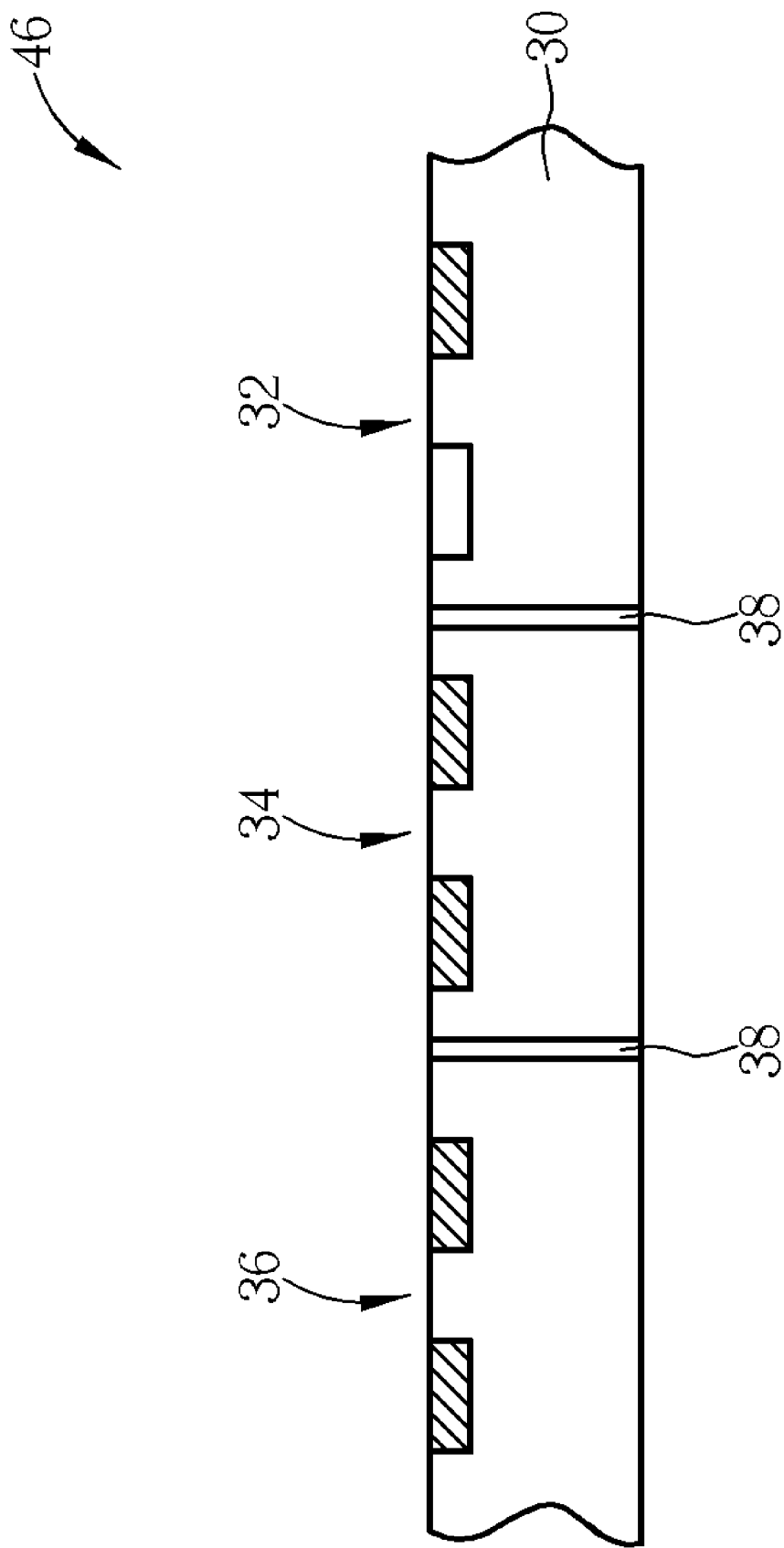
FIG. 3 to FIG. 4 are schematic diagrams of fabricating another communication chip according to the prior art.
Figure 4:
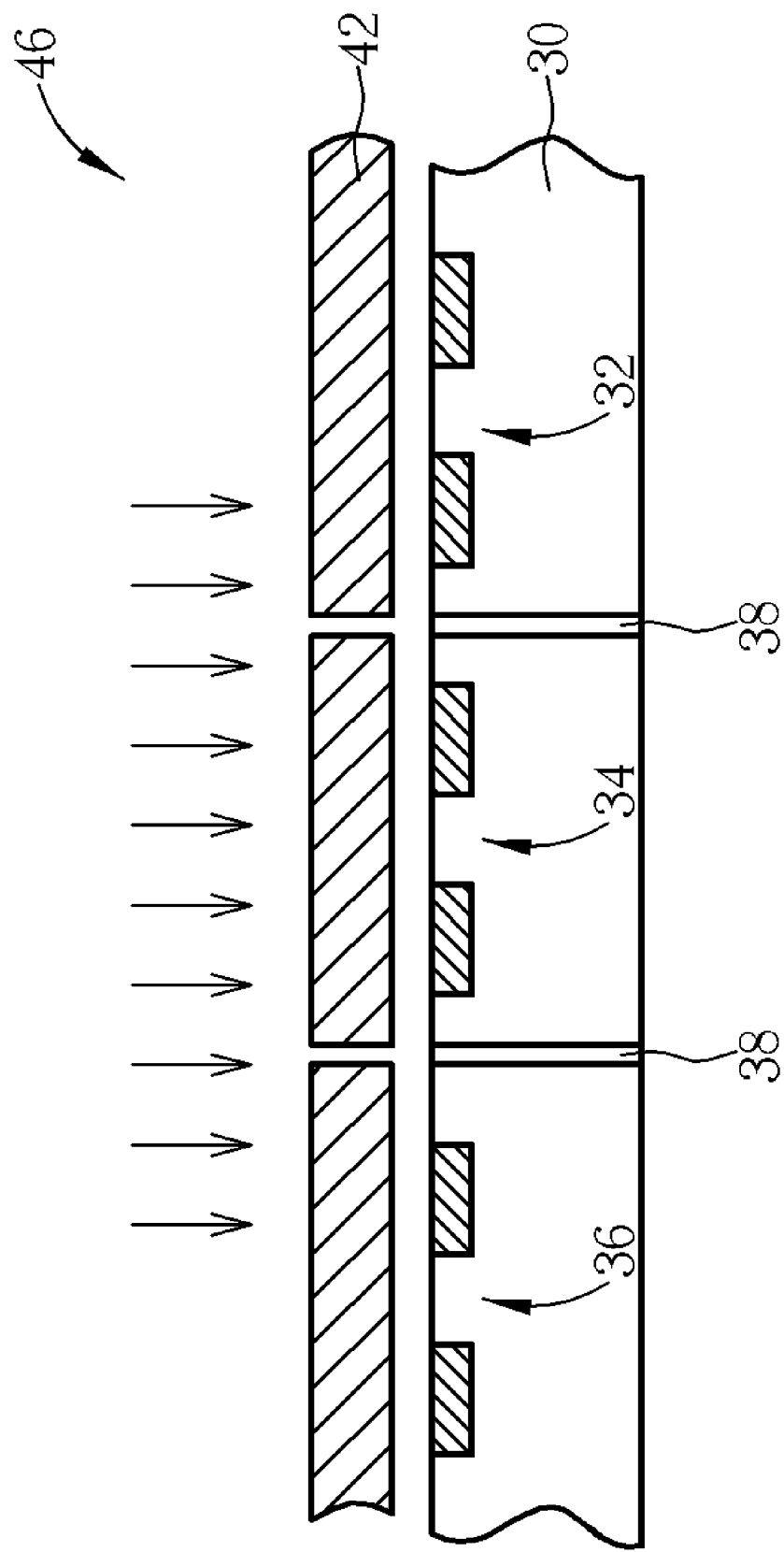
Figure 5:
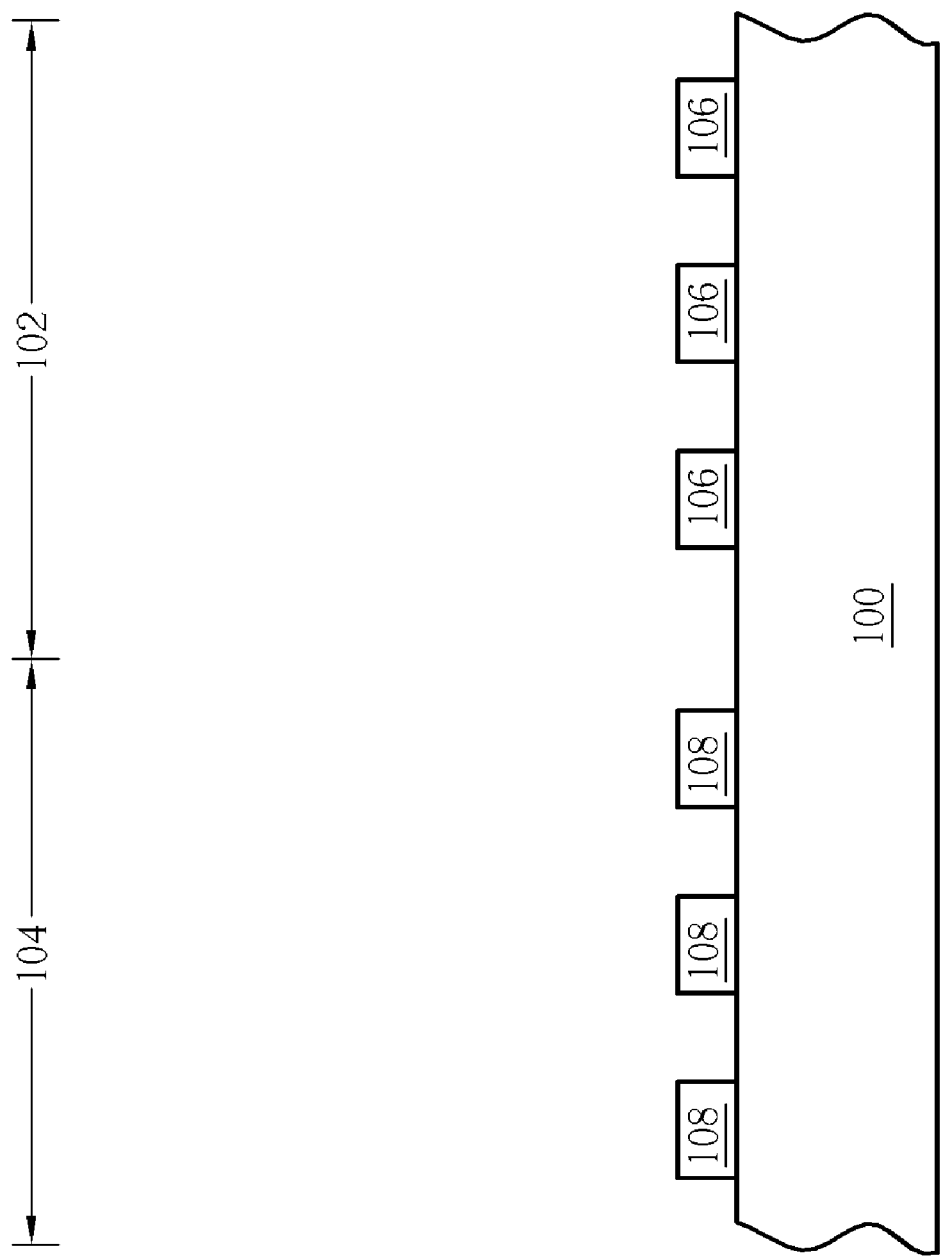
FIG. 5 to FIG. 9 are schematic diagrams of fabricating a communication chip by utilizing a semi-insulating region according to the first preferred embodiment of the present invention.

Please refer to FIG. 5 to FIG. 9 that are schematic diagrams of fabricating a communication chip by utilizing a semi-insulating region 104 according to the first preferred embodiment of the present invention. As shown in FIG. 5, the communication chip according to the first preferred embodiment of the present invention is fabricated on a semiconductor wafer 100. A non-insulating region 102 and a semi-insulating region 104 are comprised on a surface of the semiconductor substrate 100. The non-insulating region 102 is usually used for forming active devices, and the semi-insulating region 104 is usually used for forming passive devices. The semiconductor substrate 100 of the present invention is a silicon substrate, a germanium substrate, a gallium arsenide substrate, a silicon germanium substrate, an indium phosphide substrate, a gallium nitride substrate, a silicon carbide substrate, or a silicon on insulator (SOI) substrate.

According to the first preferred embodiment of the present invention, first, at least one active device 106 is formed in the non-insulating region 102 and at least one passive device 108 is formed in the semi-insulating region 104 on the surface of the semiconductor substrate 100 in accordance with circuit design. The active device 106 comprises a metal-oxide-semiconductor transistor (MOS transistor), a bipolar junction transistor (BJT), or a power amplifier. The passive device 108 comprises an antenna, a high Q inductor, a power divider, a filter, a resonator, a transmission line, or a coupler.

Figure 6:
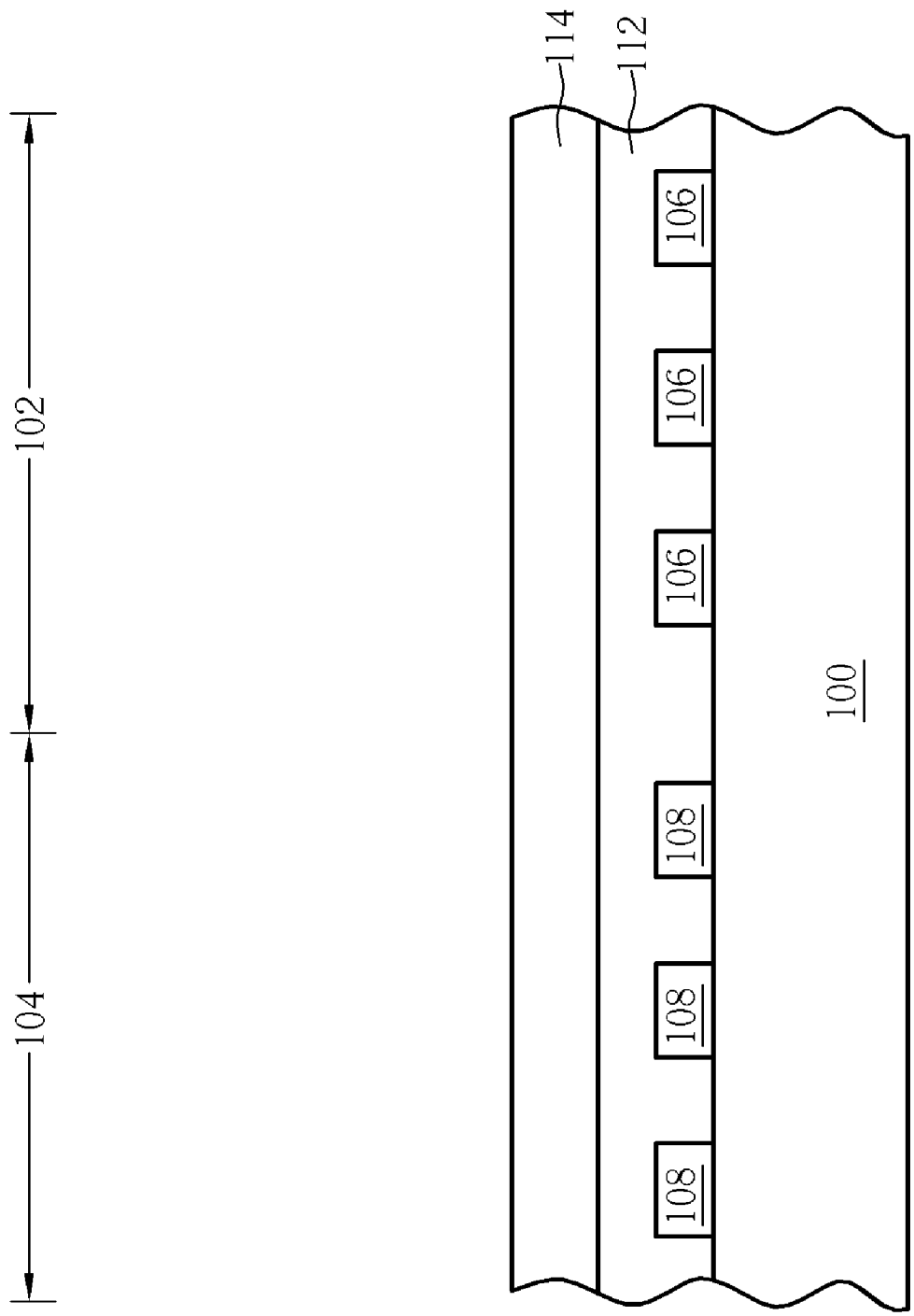
Figure 7:
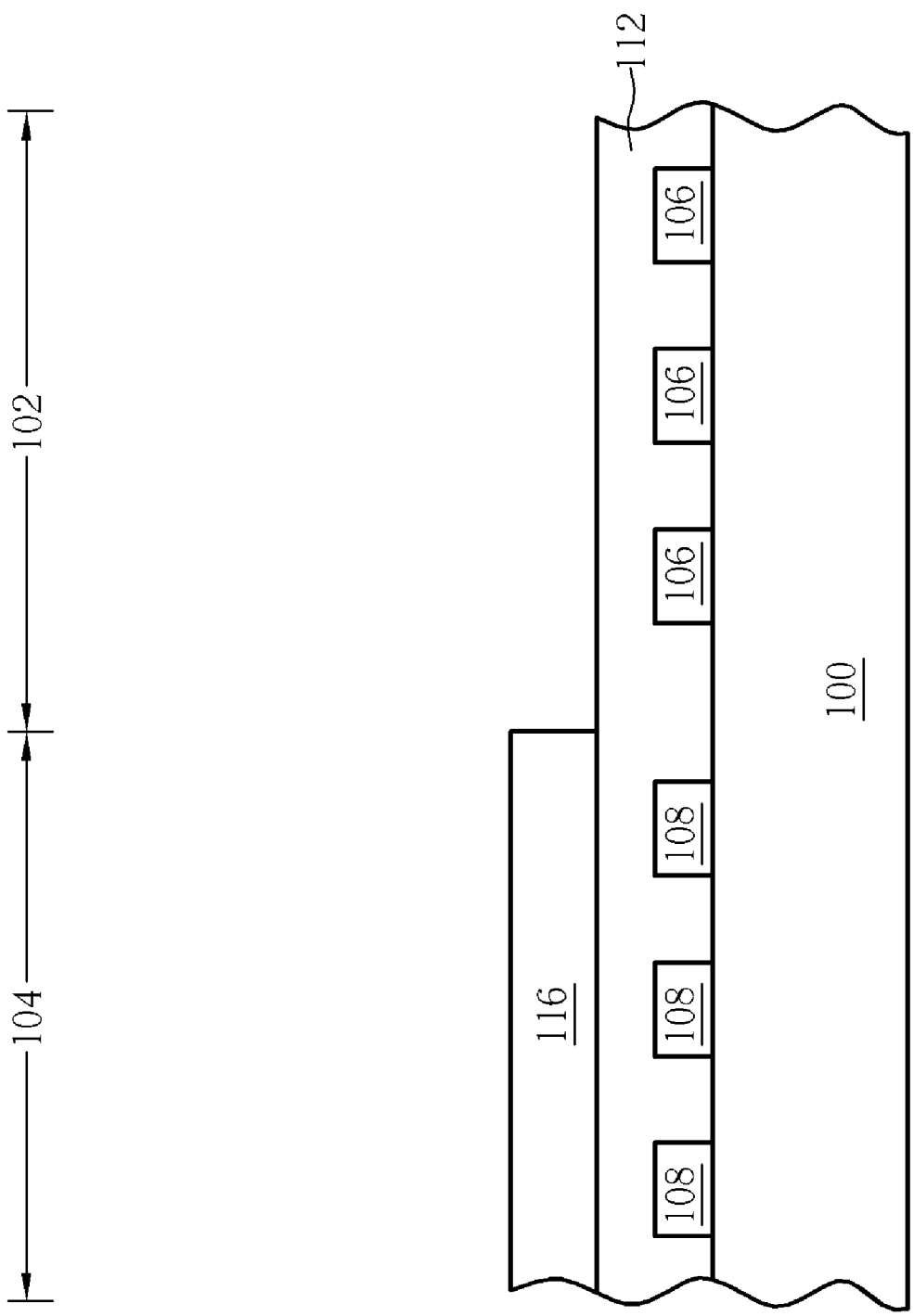

As shown in FIG. 6, then, a first isolation layer 112 is formed on the surface of the semiconductor substrate 100 to cover and electrically isolate the active devices 106 and the passive devices 108. The first isolation layer 112 is a single-layered structure or a composite-layered structure. The material composition of the first isolation layer 112 comprises silicon oxide ($SiO_x$, where $0<x\leq2.0$), silicon nitride ($SiN_y$, where $0<y\leq1.33$), or silicon oxynitride ($SiO_xN_y$, where $0<x\leq2.0$, $0<y\leq1.33$). A photoresist layer 114 is thereafter coated on a surface of the first isolation layer 112. After that, a photolithography process is performed to define and develop at least one semi-insulating region pattern 116 as shown in FIG. 7. The semi-insulating region pattern 116 covers the semi-insulating region 104 (and also covers each passive device) and is used as a particle hindering mask during the subsequent implantation process.

It is worth noticing that the semi-insulating region pattern 116, used as a mask, may be changed according to practical requirements. For example, a second isolation layer (not shown) may be first formed on the surface of the first isolation layer 112. Then, the photoresist layer 114 is formed on the second isolation layer (not shown). A photolithography process is thereafter performed to define and develop at least one semi-insulating region pattern 116 in the photoresist layer 114 (or optionally simultaneously transfer the semi-insulating region pattern 116 to the second isolation layer). The semi-insulating region pattern 116 covers the semi-insulating region 104 and is used as a mask during the subsequent implantation process. The second isolation layer (not shown) may be an adhesion layer, a block layer, an anti-reflection layer, a barrier layer, or an isolation layer having another function. The material composition of the second isolation layer (not shown) comprises silicon oxide, silicon nitride, or silicon oxynitride.

Figure 8:
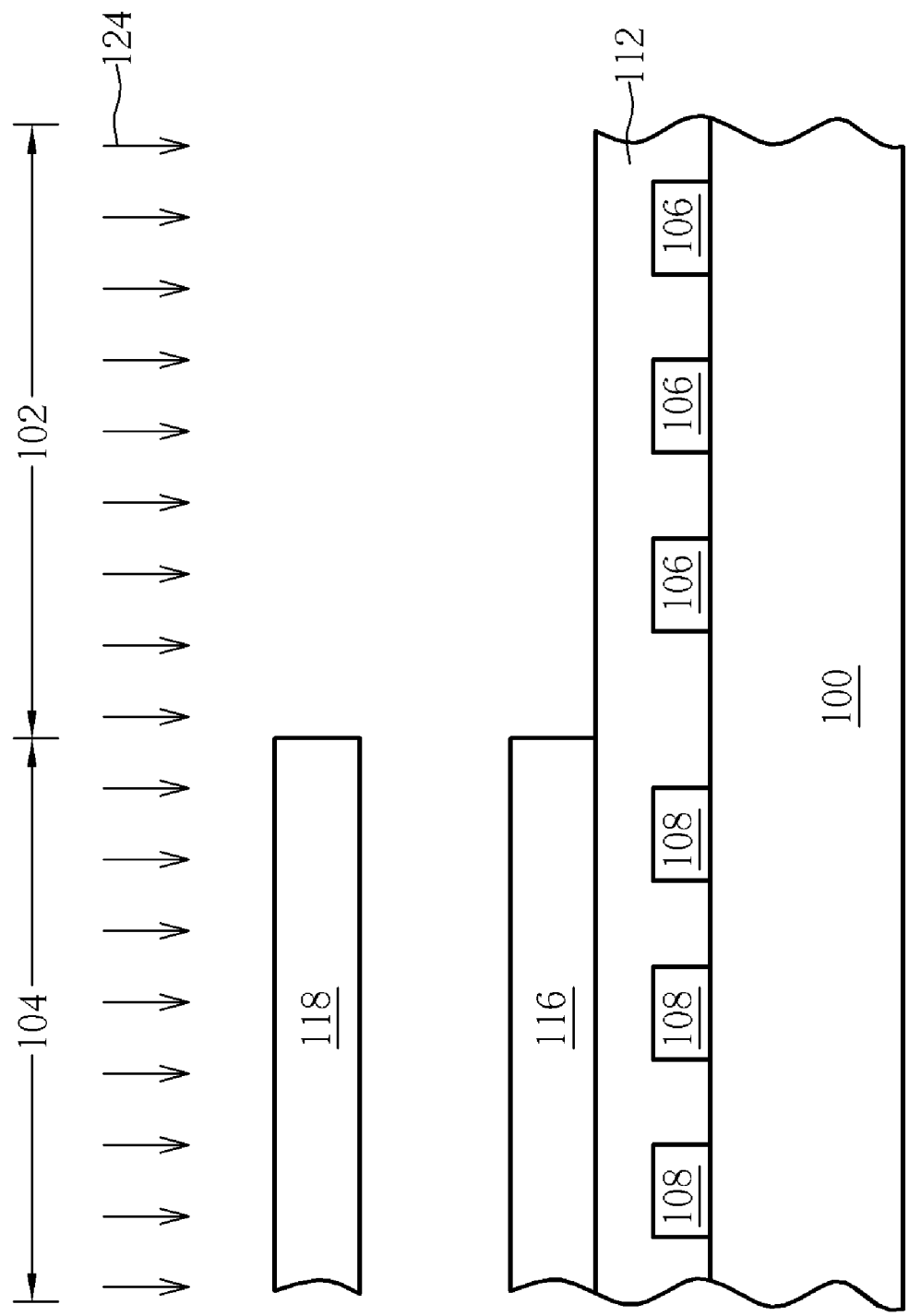

As shown in FIG. 8, at least one mask 118 is formed above the semiconductor substrate 100 to block the semi-insulating region 104. The mask 118, utilized in a clean room or in another environment, comprises a patterned dummy wafer, a metal plate formed from a high atomic weight metal material or other substances for use as a particle hindering mask. The dummy wafer, which is a bare wafer, comprises a silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The number of dummy wafers can be adjusted according to the practical requirements.

Subsequently, the semi-insulating region 104 is implanted with a high energy beam of particles 124 by utilizing the mask 118 and the semi-insulating region pattern 116 as a particle hindering mask. The objective of implanting the semi-insulating region 104 with a high energy beam of particles 124 is to damage the structure of the semiconductor substrate 100 to a specific depth (not shown in the figures) in the semi-insulating region 104 so as to greatly increase the resistivity of the semiconductor substrate 100 in the semi-insulating region 104. The substrate loss phenomena and the unexpected coupling phenomena are thus improved. The particles in the high energy beam of particles 124 comprise protons, hydrogen atoms, deuterons, tritons, alpha ($\alpha$) particles, molecular nitrogen ions, or molecular oxygen ions.

When the region outside the semi-insulating region 104 (the non-insulating region) is implanted with the high energy beam of particles 124, the high energy particles will penetrate through the semiconductor substrate 100 outside the semi-insulating region 104 protected by the particle hindering mask protecting the structure of the semiconductor substrate 100 outside the semi-insulating region 104 from being damaged. Otherwise the high energy particles only do negligible damage to the semiconductor substrate 100 near the surface, or only do negligible damage to the portion deeper than the semi-insulating region 104 in the semiconductor substrate.

By adjusting the following parameters, such as the energy of the high energy beam of particles 124, the thickness and material composition of the photoresist layer 114 and the second isolation layer (not shown), the quantity and the material composition of the mask 118, and whether only adapting the photoresist layer 114 (and the second isolation layer) as a hindering mask and only adapting the mask 118 as a hindering mask, the high energy beam of particles 124 reaches an expected depth in the semiconductor substrate 100. In addition, at least one third isolation layer (not shown) may be included between the semiconductor substrate 100 and the passive device 108, in accordance with the requirements of a specific design or process.

Figure 9:
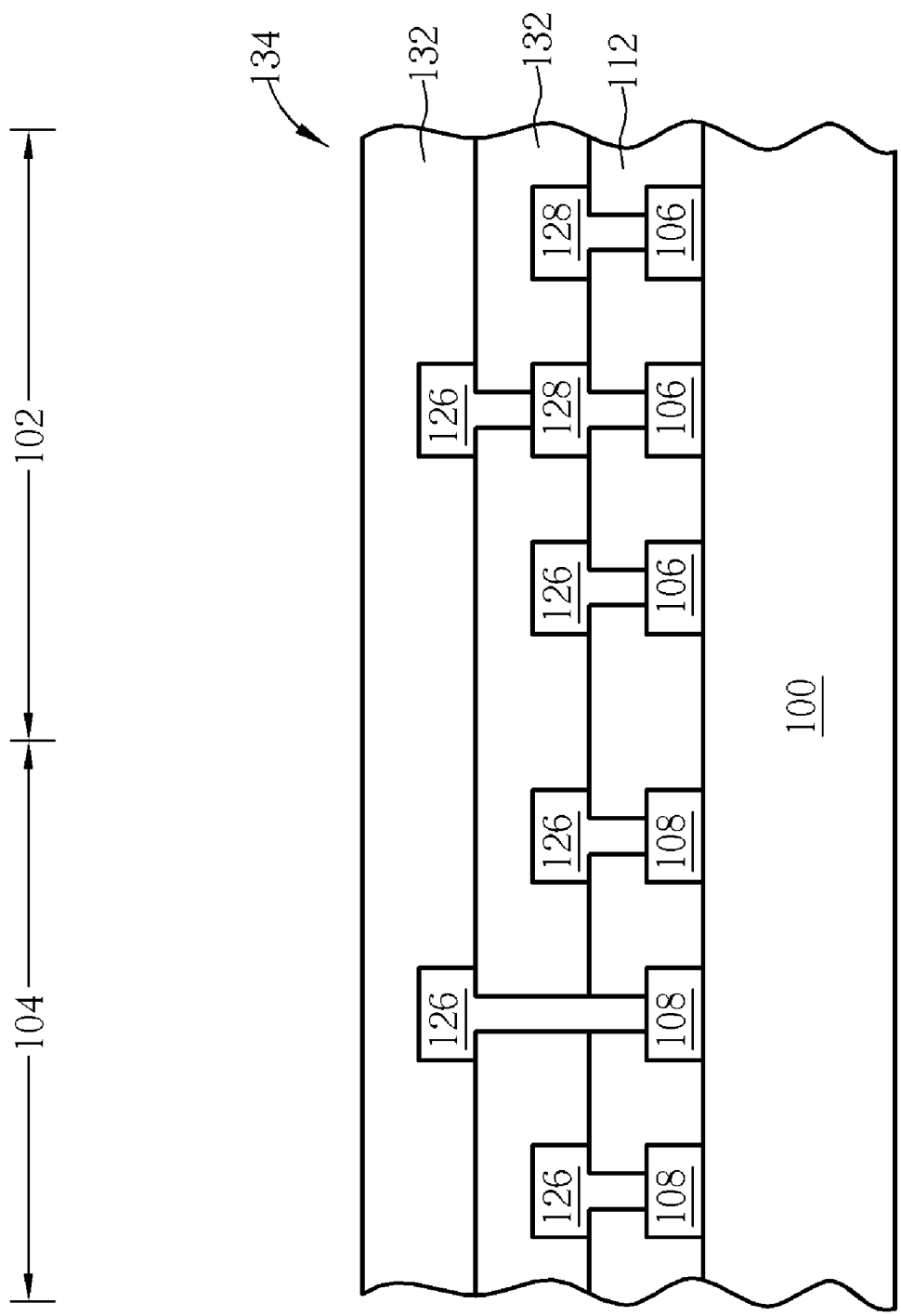

As shown in FIG. 9, a multilevel metallization process is performed after removing the semi-insulating region pattern 116. By forming stacked metal lines 126, interconnects 128, and low dielectric constant layers (low k layers) 132, the active devices 106 and the passive devices 108 are respectively electrically connected to at least one bonding pad (not shown), at least one metal line 126, or at least one interconnect 128. The communication chip 134 is thus completed.

It is worth noticing that the processes for forming the semi-insulating region pattern 116 and implanting the high energy beam of particles 124 may be performed after the multilevel metallization process is completed; or may be performed at a halfway point of the multilevel metallization process. In the latter case, a lower level metallization process is performed before forming the semi-insulating region pattern 116, and an upper level metallization process is performed after implanting the high energy beam of particles 124 and removing the semi-insulating region pattern 116. Under these two circumstances, if there is the second isolation layer (not shown) underneath the semi-insulating region pattern 116, used for defining the semi-insulating region 104, a low temperature process is the only choice for forming the second isolation layer (not shown) to avoid affecting the as-formed metal lines 126 and the interconnects 128.

Figure 10:
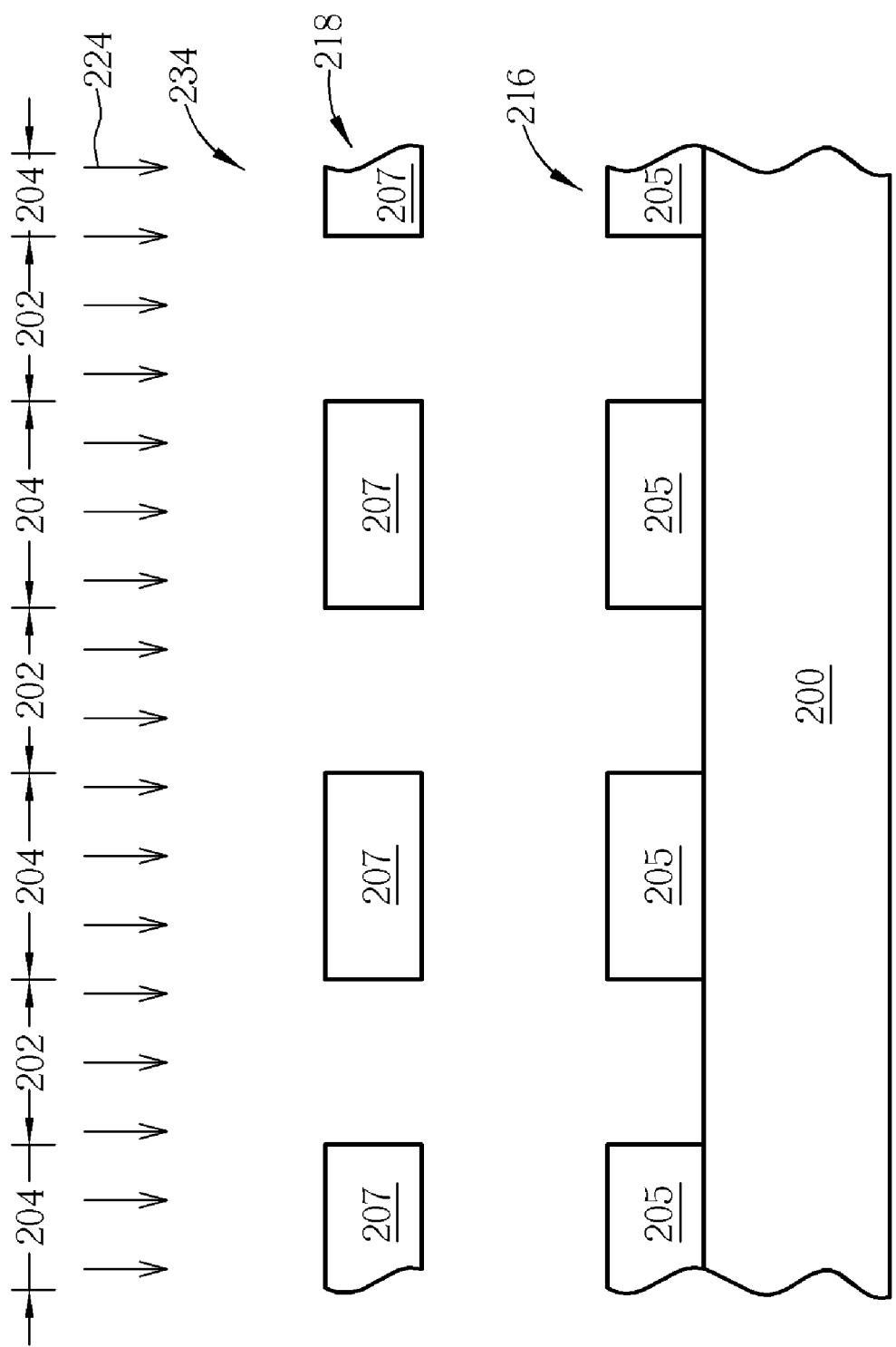
FIG. 10 is a schematic diagram of fabricating a communication chip by utilizing a semi-insulating region according to the second preferred embodiment of the present invention.

Please refer to FIG. 10 that is a schematic diagram of fabricating a communication chip 234 by utilizing a semi-insulating region 204 according to the second preferred embodiment of the present invention. Because the substrate and the mask utilized for the communication chip in the second preferred embodiment and some of the processes performed in the second preferred embodiment are same as those in the first preferred embodiment, they are not mentioned again in the second preferred embodiment. As shown in FIG. 10, the communication chip 234 according to the second preferred embodiment of the present invention is fabricated on a semiconductor substrate 200. A plurality of nonadjacent non-insulating regions 202 are comprised on a surface of the semiconductor substrate 200. All of the non-insulating regions 202 are surrounded by a semi-insulating region 204. When performing the second preferred embodiment of the present invention, a plurality of continuous first patterns 205 are defined in the semi-insulating region pattern 216, and the semi-insulating region pattern 216 covers the semi-insulating region 124. A plurality of continuous second patterns 207 are defined in the mask 218, and the second mask 218 covers the semi-insulating region 204. In FIG. 10, such a pattern layout is represented by a cross-sectional diagram.

When the semi-insulating region 204 is implanted with a high energy beam of particles 224 by utilizing the mask 218 and the semi-insulating region pattern 216 as a particle hindering mask, a plurality of nonadjacent non-insulating regions 202 are formed in the semiconductor substrate 200. The plurality of non-insulating regions 202 are surrounded by a semi-insulating region 204. After performing some further processes (not shown), the fabrication of the communication chip 234 is completed. To utilize the semi-insulating region 204 in fabricating the communication chip 234 according to the second preferred embodiment of the present invention, the induced currents are confined within each non-insulating region 202 as many individual small currents. The effect incurred from the induced current is relatively weakened. The antenna effect is also thus reduced. As a result, the method disclosed in the second preferred embodiment of the present invention is very suitable for application in high frequency products.

Figure 11:
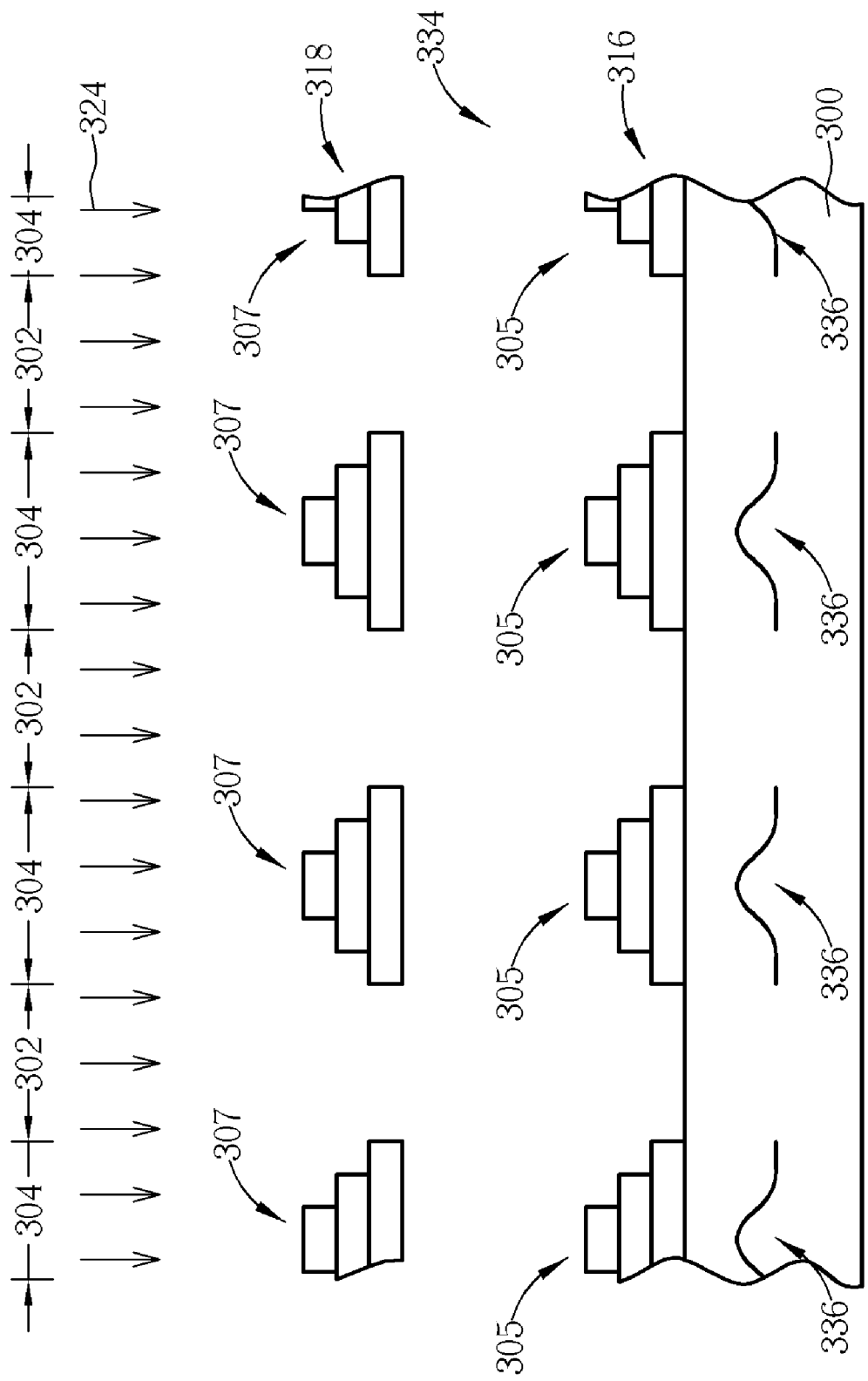
FIG. 11 is a schematic diagram of fabricating a communication chip by utilizing a semi-insulating region according to the third preferred embodiment of the present invention.

Please refer to FIG. 11 that is a schematic diagram of fabricating a communication chip 334 by utilizing a semi-insulating region 304 according to the third preferred embodiment of the present invention. Because the substrate and the mask utilized for the communication chip in the third preferred embodiment and some of the processes performed in the third preferred embodiment are same as those in the first and the second preferred embodiments, they are not mentioned again in the third preferred embodiment. As shown in FIG. 11, the communication chip 334 according to the third preferred embodiment of the present invention is fabricated on a semiconductor substrate 300. A plurality of nonadjacent non-insulating regions 302 are comprised on a surface of the semiconductor substrate 300. All of the non-insulating regions 302 are surrounded by a semi-insulating region 304. When performing the third preferred embodiment of the present invention, a plurality of continuous first patterns 305 are defined in the semi-insulating region pattern 316, and the semi-insulating region pattern 316 covers the semi-insulating region 304. A plurality of continuous second patterns 307 are defined in the mask 318, and the second mask 318 covers the semi-insulating region 304. In FIG. 11, such a pattern layout is represented by a cross-sectional diagram.

The feature of the third preferred embodiment of the present invention is that the first pattern 305 in the semi-insulating region pattern 316 has a plurality of thicknesses. Similarly, the second pattern 307 in the mask 318 has a plurality of thicknesses. Since the semi-insulating region pattern 316 and the mask 318 are both used to reduce the implantation energy of a high energy beam of particles 324, the implantation energy of the high energy beam of particles 324 is reduced by different extents due to the various thicknesses of the first pattern 305 and the second pattern 307. After the implantation process, the structure of the semiconductor substrate 300 in the semi-insulating region 304 is damaged to different depths according to the design of the first pattern 305 and the second pattern 307. Therefore, at least one resistivity profile 336 is formed in the semiconductor substrate 300 in the semi-insulating region 304. The first pattern 305 and the second pattern 307 shown in FIG. 11 are formed by multiple depositing and etching processes. Of course, the first pattern 305 and the second pattern 307 may be formed by other methods.

Figure 12:
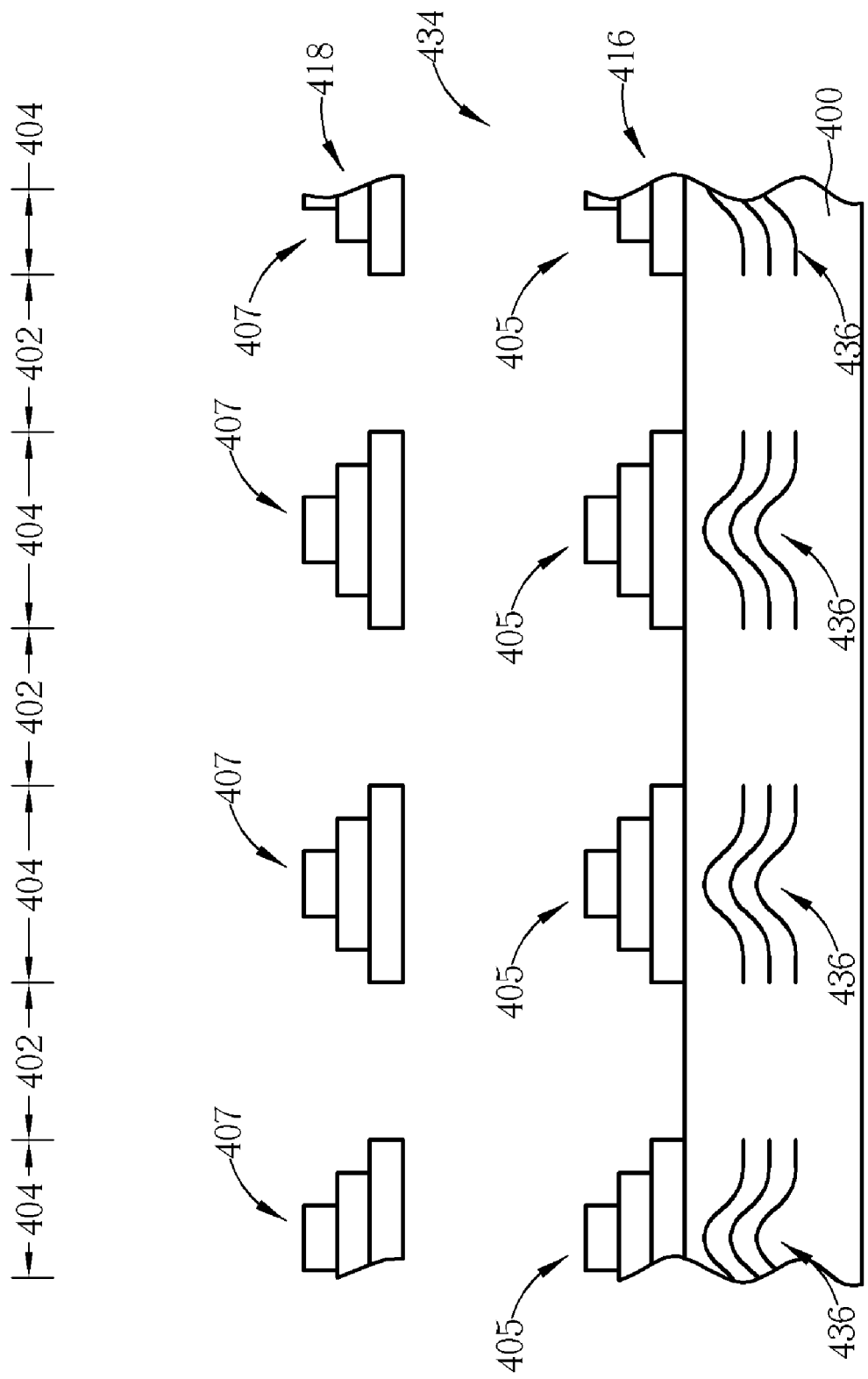
FIG. 12 is a schematic diagram of fabricating a communication chip by utilizing a semi-insulating region according to the fourth preferred embodiment of the present invention.

Please refer to FIG. 12 that is a schematic diagram of fabricating a communication chip 434 by utilizing a semi-insulating region 404 according to the fourth preferred embodiment of the present invention. Because the substrate and the mask utilized for the communication chip 434 in the fourth preferred embodiment and some of the processes performed in the fourth preferred embodiment are same as those in the first, the second, and the third preferred embodiments, they are not mentioned again in the fourth preferred embodiment. As shown in FIG. 12, the communication chip 434 according to the fourth preferred embodiment of the present invention is fabricated on a semiconductor substrate 400. A plurality of nonadjacent non-insulating regions 402 are comprised on a surface of the semiconductor substrate 400. All of the non-insulating regions 402 are surrounded by a semi-insulating region 404. When performing the fourth preferred embodiment of the present invention, a plurality of continuous first patterns 405 are defined in the semi-insulating region pattern 416, and the semi-insulating region pattern 416 covers the semi-insulating region 404. A plurality of continuous second patterns 407 are defined in the mask 418, and the second mask 418 covers the semi-insulating region 404. In FIG. 12, such a pattern layout is represented by a cross-sectional diagram.

The feature of the fourth preferred embodiment of the present invention is to perform multiple high energy particle beam implantation processes (not shown). By adjusting the implantation energy of the high energy beams of particles, or by adjusting the thickness of the first pattern 405 in the semi-insulating region pattern 416 and the thickness of the second pattern 407 in the mask 418, a plurality of resistivity profiles 436 are formed in the semiconductor substrate 400 in the semi-insulating region 404 after the implantation processes. The first pattern 405 and the second pattern 407 shown in FIG. 12 are both representative patterns.

Figure 13:
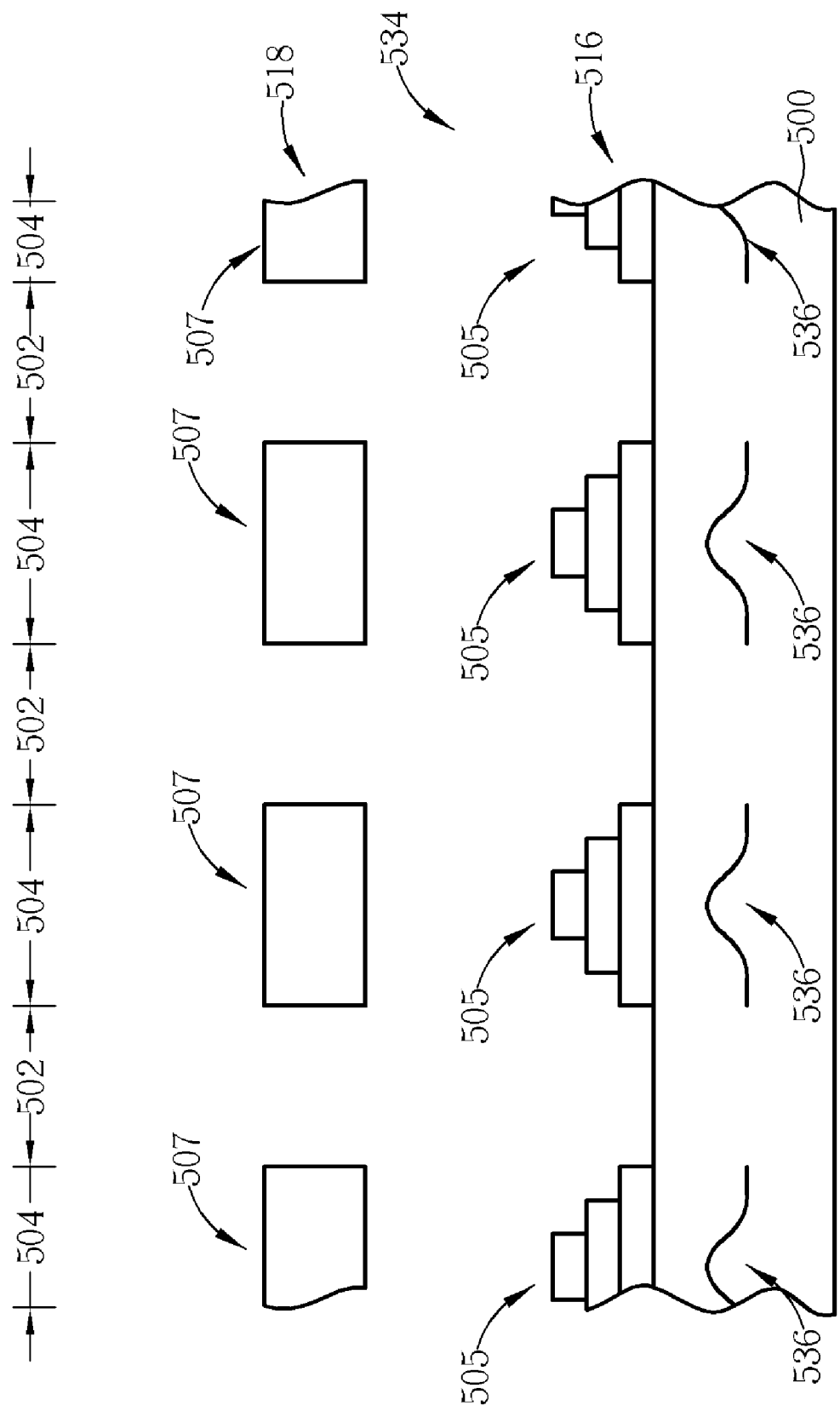
FIG. 13 is a schematic diagram of fabricating a communication chip by utilizing a semi-insulating region according to the fifth preferred embodiment of the present invention.

Please refer to FIG. 13 that is a schematic diagram of fabricating a communication chip 534 by utilizing a semi-insulating region 504 according to the fifth preferred embodiment of the present invention. During the high energy particle beam implantation process, the first pattern in the semi-insulating region pattern may have various thicknesses when the second pattern in the mask has a single thickness; or optionally the second pattern in the mask may have various thicknesses when the first pattern in the semi-insulating region pattern has a single thickness according to the present invention. Therefore, the particle hindering mask may be designed as either case. For example, the communication chip 534 according to the fifth preferred embodiment of the present invention is fabricated on a semiconductor substrate 500. A plurality of nonadjacent non-insulating regions 502 are comprised on a surface of the semiconductor substrate 500. All of the non-insulating regions 502 are surrounded by a semi-insulating region 504, as shown in FIG. 13.

The first pattern 505 in the semi-insulating region pattern 516 has various thicknesses and the second pattern 507 in the mask 518 has a single thickness. By utilizing the mask 518 and the semi-insulating region pattern 516, at least one resistivity profile 536 can be formed in the semiconductor substrate 500 in the semi-insulating region 504. After performing some further processes (not shown), the fabrication of the communication chip 534 is completed. Because the substrate and the mask utilized for the communication chip 534 in the fifth preferred embodiment and some of the processes performed in the fifth preferred embodiment are same as those in the first, the second, the third and the fourth preferred embodiments, they are not mentioned again in the fifth preferred embodiment.

Figure 14:
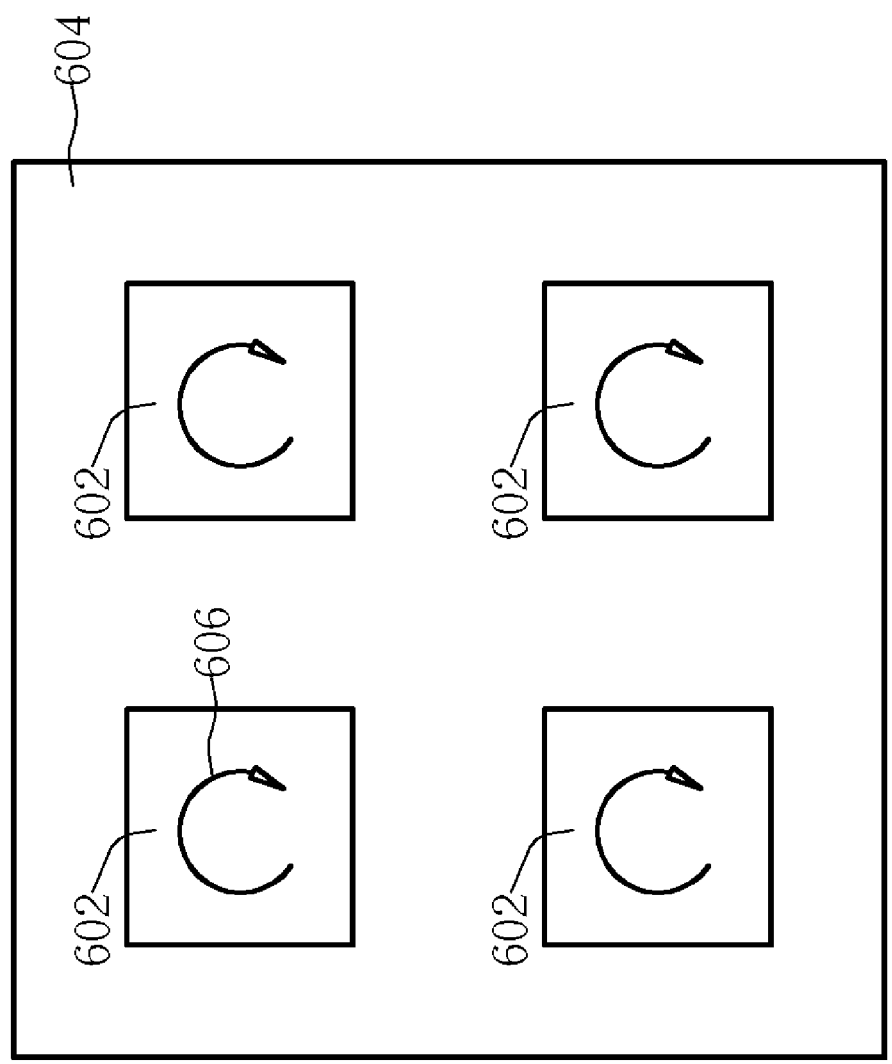
FIG. 14 is a schematic diagram showing a method for weakening the effect incurred from induced currents.

Please refer to FIG. 14 that is a schematic diagram showing a method for weakening the effect incurred from induced currents 606. As shown in FIG. 14, a plurality of non-destructed substrate regions 602 are surrounded by a destructed substrate region 604. The non-destructed substrate regions 602 are equivalent to the non-insulating regions 202, 302, 402, 502 of the preferred embodiments of the present invention. The destructed substrate region 604 is equivalent to the semi-insulating region 204, 304, 404, 504 of the preferred embodiments of the present invention. The destructed substrate region 604, according to the different preferred embodiments, may be a region having a single resistivity value or a region having a resistivity profile. Theoretically, the larger the non-destructed substrate region 602 is, the larger the induced current is, resulting in a poor electromagnetic insulating ability. If a plurality of non-destructed substrate regions 602 are formed in a same area, the induced current 606 in each of the non-destructed substrate region 602 resulted from electromagnetic effect becomes smaller. To speak more clearly, the more non-destructed substrate regions 602 formed in the same area, the smaller the induced current 606 in each of the non-destructed regions 602. Under the circumstances, the induced current 606 in each of the non-destructed substrate region 602 tends to be interfered and cancelled by other induced current to form a better electromagnetic insulation.

Figure 15:
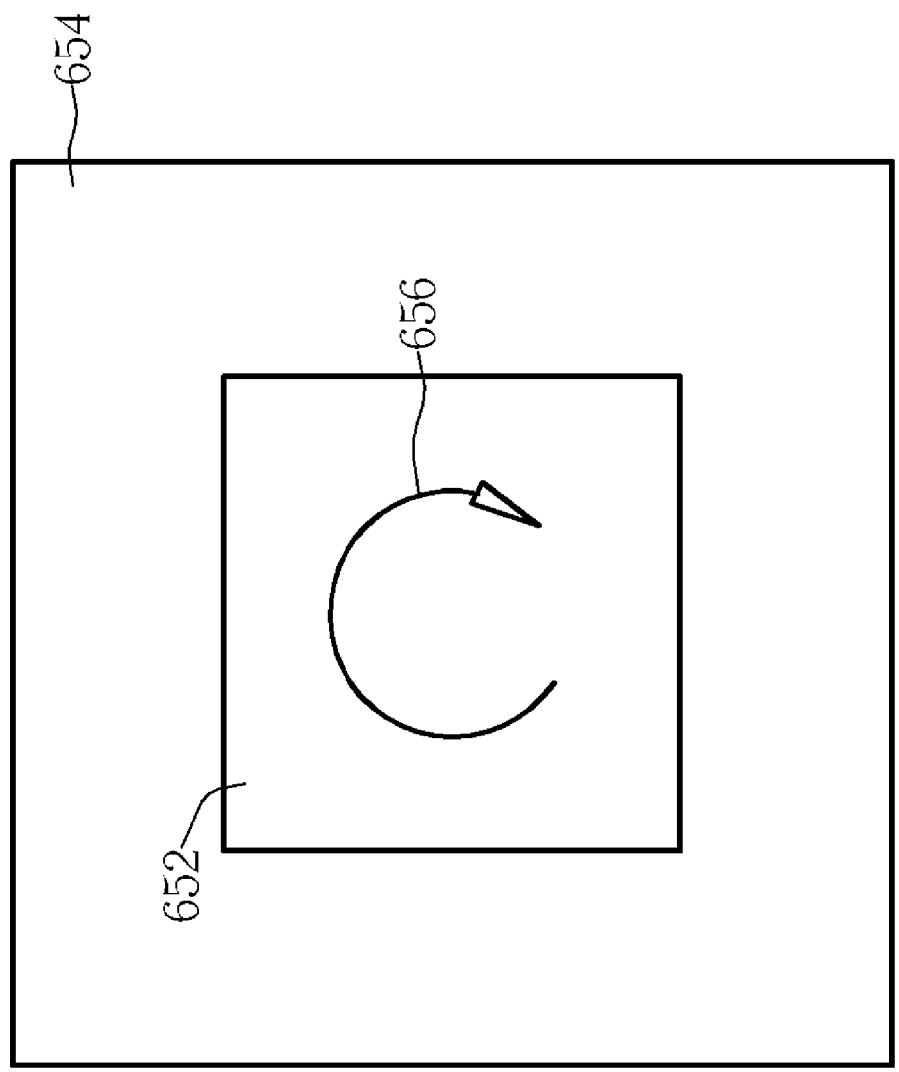
FIG. 15 is a schematic diagram showing a method for isolating the induced current.

Please refer to FIG. 15 that is a schematic diagram showing a method for isolating the induced current 656. In FIG. 14, a plurality of non-destructed substrate regions 602 are surrounded by a destructed substrate region 604. However, the present invention method may be applied to the situation that one non-destructed substrate region 652 is surrounded by a destructed substrate region 654. Under the circumstances, the total effect of weakening the induced current is not as strong as the total effect illustrated in FIG. 14, but the induced current 656 is able to be isolated. As shown in FIG. 15, the single non-destructed substrate region 652 is isolated in the destructed substrate region 654. The method of forming the non-destructed substrate region 652, in which the induced current 656 is generated due to electromagnetic effect, may refer to the non-insulating region of each of the preferred embodiments of the present invention. The method of forming the destructed substrate region 654 may refer to the semi-insulating region of each of the preferred embodiments of the present invention. In other words, the induced current 656 is isolated in non-destructed substrate region 652 and will not affect other portions of the semiconductor substrate (not shown).

The method of forming the communication chip by utilizing a semi-insulating region according to the present invention utilizes at least one semiconductor wafer, metal plate, or other substance as the first mask and the photoresist layer as the second mask. A first pattern and a second pattern are optionally used in the first mask and in the second mask, respectively. Since various parameters, such as the material composition of masks, the pattern shape, the pattern distribution and pattern thickness, the implantation energy of the high energy beam of particles, and the number of masks, etc. can be adjusted, the process result can be precisely controlled. Therefore, when performing the high energy beam of particles implantation processes, the high energy particles can be implanted into the semiconductor substrate to a predetermined depth accurately so as to form uniform and continuous semi-insulating regions and even to form three dimensional semi-insulating regions in the semiconductor substrate. When applying the present invention method to a practical production line, the effect incurred from the induced current is weakened owing to the induced current being confined within each non-insulating region so as to reduce the antenna effect. The substrate loss for a chip is reduced, the total coupling effect is improved, and the noise in a transmission line is decreased. A communication chip with good RF performance is therefore produced.

In contrast to the prior art method of forming a communication chip by utilizing the semi-insulating region formed by an implantation process and the mask made from a metal material, the present invention method utilizes at least one semiconductor wafer, metal plate, or other substance as the first mask and the photoresist layer as the second mask to perform the high energy beam of particles implantation process. Therefore, not only are the material compositions of the masks variable, the shape and the thickness of the first pattern and the second pattern optionally defined in the first mask and in the second mask respectively can be changed according to the requirement of the product. Furthermore, the implantation energy of the high energy beam of particles can be adjusted. The first mask and the second mask can be simultaneously utilized or individually utilized. The implantation process may be performed several times when the above-mentioned parameters are adjusted. Utilizing the masks in the present invention method as energy reduction layers, the high energy particles can be implanted into the semiconductor substrate to a predetermined depth accurately so as to form uniform semi-insulating regions. The present invention method even forms one resistivity profile or a plurality of resistivity profiles in the semiconductor substrate to achieve the objective of forming the three dimensional semi-insulating regions in the semiconductor substrate. In addition, a plurality of nonadjacent non-insulating regions, which are surrounded by the semi-insulating region, are formed in the semiconductor substrate. Appling this feature to a communication chip confines the induced currents within each non-insulating region so that they become individual small currents. The effect incurred from the smaller induced currents is relatively weakened reducing the antenna effect. A communication chip with good RF performance is therefore produced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming at least one semi-insulating region in a semiconductor substrate, the method comprising:
    forming at least one first mask above the semiconductor substrate, the first mask having a plurality of thicknesses and blocking the semi-insulating region;
    forming a second mask on a surface of the semiconductor substrate, the second mask covering the semi-insulating region;
    implanting the semi-insulating region with a high energy beam of particles by utilizing the second mask and the first mask as particle hindering masks; and removing the second mask.

2. The method of claim 1 wherein the semiconductor substrate comprises a silicon substrate, a germanium substrate, a gallium arsenide substrate, a silicon germanium substrate, an indium phosphide substrate, a gallium nitride substrate, a silicon carbide substrate, or a silicon on insulator (SOI) substrate.

3. The method of claim 1 wherein a plurality of nonadjacent non-insulating regions are comprised on the surface of the semiconductor substrate.

4. The method of claim 3 wherein a plurality of nonadjacent first patterns are defined in the first mask, each first pattern is used for defining the plurality of nonadjacent non-insulating regions.

5. The method of claim 3 wherein a plurality of nonadjacent second patterns are defined in the second mask, each second mask is used for defining the plurality of nonadjacent non-insulating regions.

6. The method of claim 5 wherein the second pattern has a plurality of thicknesses.

7. The method of claim 1 wherein to implant the semi-insulating region with the high energy beam of particles is to damage the structure of the semiconductor substrate to a specific depth in the semi-insulating region so as to increase the resistivity of the semiconductor substrate in the semi-insulating region.

8. The method of claim 1 wherein at least one first isolation layer is comprised on the surface of the semiconductor substrate.

9. The method of claim 8 wherein at least one active device and at least one passive device are comprised between the surface of the semiconductor substrate and the first isolation layer.

10. The method of claim 9 wherein the active device comprises a metal-oxide-semiconductor transistor (MOS transistor), a bipolar junction transistor (BJT), or a power amplifier, and the passive device comprises an antenna, a high quality factor inductor (high Q inductor), a power divider, a filter, a resonator, a transmission line, or a coupler.

11. The method of claim 9 wherein the second mask is a composite layer and the composite layer is a stacked structure of a patterned photoresist layer and a second isolation layer from top to bottom.

12. The method of claim 11 wherein the second isolation layer comprises a silicon oxide layer ($SiO_x$ layer, $0<x\leq2.0$), a silicon nitride layer ($SiN_y$ layer, $0<y\leq0.33$), or a silicon oxynitride layer ($SiO_xN_y$ layer, $0<x\leq2.0$, $0<y\leq1.33$) formed by a low temperature process.

13. The method of claim 12 wherein a multilevel metallization process is performed before forming the second isolation layer to electrically connect the active device and the passive device to at least one bonding pad, at least one metal line, or at least one interconnect.

14. The method of claim 12 wherein a lower level metallization process is performed before forming the second isolation layer, an upper level metallization process is performed after removing the second mask to electrically connect the active device and the passive device to at least one bonding pad, at least one metal line, or at least one interconnect.

15. The method of claim 9 wherein a multilevel metallization process is performed after removing the second mask to electrically connect the active device and the passive device to at least one bonding pad, at least one metal line, or at least one interconnect.

16. The method of claim 9 wherein at least one third isolation layer is comprised between the semiconductor substrate and the device in the semi-insulating region.

17. The method of claim 1 wherein the first mask comprises a patterned dummy wafer or a metal plate formed from a high atomic weight metal material.

18. The method of claim 17 wherein the dummy wafer comprises a silicon substrate, a germanium substrate, a gallium arsenide substrate, a silicon germanium substrate, an indium phosphide substrate, a gallium nitride substrate, a silicon carbide substrate, or a silicon on insulator (SOI) substrate.

19. The method of claim 1 wherein the second mask is a patterned photoresist layer.

20. The method of claim 1 wherein the high energy particles comprise protons, hydrogen atoms, deuterons, tritons, alpha ($\alpha$) particles, molecular nitrogen ions, or molecular oxygen ions.

21. The method of claim 1 wherein to implant the semi-insulating region with the high energy beam of particles is to make the high energy beam of particles penetrate through the semiconductor substrate outside the semi-insulating region so as to prevent the structure of the semiconductor substrate outside the semi-insulating region from being damaged.

22. The method of claim 21 wherein the semiconductor substrate penetrated through by the high energy beam of particles is not insulated.

* * * * *